(12) United States Patent
Na et al.

(10) Patent No.: US 8,228,282 B2
(45) Date of Patent: Jul. 24, 2012

(54) GATE DRIVING CIRCUIT, DISPLAY APPARATUS HAVING THE SAME, AND METHOD THEREOF

(75) Inventors: Byoung-Sun Na, Hwaseong-si (KR); Dong-Hyeon Ki, Seoul (KR); Min-Cheol Lee, Seoul (KR); Soon-Il Ahn, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 1302 days.

(21) Appl. No.: 11/928,466

(22) Filed: Oct. 30, 2007

(65) Prior Publication Data

US 2008/0100560 A1  May 1, 2008

(30) Foreign Application Priority Data

Oct. 31, 2006 (KR) .......................... 10-2006-0106665

(51) Int. Cl.
*G09G 3/36* (2006.01)

(52) U.S. Cl. ....................................................... 345/100

(58) Field of Classification Search ..................... 345/87, 345/98–100, 204; 377/64–81; 340/12.21
See application file for complete search history.

(56) References Cited

U.S. PATENT DOCUMENTS

| 2002/0003964 A1* | 1/2002 | Kanbara et al. ............... 396/661 |
| 2003/0043104 A1 | 3/2003 | Lee et al. |
| 2005/0275609 A1 | 12/2005 | Lee et al. |
| 2006/0061562 A1 | 3/2006 | Park et al. |

OTHER PUBLICATIONS

European Patent Office Communication for application No. 07020259.3-1228 dated Dec. 3, 2009.
European Search Report for application No. 07020259.3-1228/ 1918938 dated Jun. 3, 2009.

* cited by examiner

*Primary Examiner* — Sumati Lefkowitz
*Assistant Examiner* — Robert E Carter, III
(74) *Attorney, Agent, or Firm* — Cantor Colburn LLP

(57) ABSTRACT

In a gate driving circuit and a display apparatus having the gate driving circuit, a pull-up transistor of a present stage among plural stages, which are connected one after another to each other and sequentially output a gate signal, pulls up a present gate signal output through an output terminal to a gate-on voltage. A buffer transistor is connected to a control terminal of the pull-up transistor to receive a previous output signal from a previous stage and to turn on the pull-up transistor. The buffer transistor has a chargeability that is about two times or greater than the chargeability of the pull-up transistor. Thus, the size of the pull-up transistor may be reduced, thereby preventing a malfunction of the gate driving circuit when the gate driving circuit is operated under conditions of high temperature or low temperature.

20 Claims, 7 Drawing Sheets

GATE DRIVING CIRCUIT, DISPLAY APPARATUS HAVING THE SAME, AND METHOD THEREOF

This application claims priority to Korean Patent Application No. 2006-106665, filed on Oct. 31, 2006, and all the benefits accruing therefrom under 35 U.S.C. §119, the contents of which in its entirety are herein incorporated by reference.

BACKGROUND OF THE INVENTION

1. Field of the Invention

The present invention relates to a gate driving circuit, a display apparatus having the gate driving circuit, and a method thereof. More particularly, the present invention relates to a gate driving circuit capable of improving temperature characteristics, a display apparatus having the gate driving circuit, and a method of improving temperature characteristics in a display apparatus.

2. Description of the Related Art

In general, a liquid crystal display ("LCD") includes an LCD panel having a lower substrate, an upper substrate facing the lower substrate and a liquid crystal layer interposed between the lower substrate and the upper substrate in order to display an image.

The LCD panel includes a plurality of gate lines, a plurality of data lines and a plurality of pixels connected to the gate lines and the data lines. The LCD further includes a gate driving circuit directly formed thereonto through a thin film process in order to sequentially output a gate signal to the gate lines.

Generally, a gate driving circuit includes a shift register in which plural stages are connected one after another to each other. Each of the stages includes a plurality of driving transistors to apply the gate signal to a corresponding gate line of the gate lines. Each of the stages includes a pull-up transistor connected to a gate line and outputs a gate voltage to the gate line.

Control electrodes of the pull-up transistor are commonly connected to a Q-node in each stage. The electric potential at the Q-node is maintained in a turn-on voltage that is higher than a threshold voltage during a 1H period where a gate signal is maintained at high state, but the electric potential at the Q-node is maintained in a turn-off voltage that is lower than the threshold voltage during a remained time except the 1H period of one frame where the gate signal is maintained at low state.

BRIEF SUMMARY OF THE INVENTION

In a conventional liquid crystal display ("LCD"), since a ripple voltage at the Q-node increases when the gate driving circuit is operated under conditions of high temperature, a pull-up transistor is turned on during a remained time except the 1H period of the one frame, so that a malfunction occurs in the gate driving circuit. Also, since a current driving ability of the pull-up transistor decrease when the LCD is operated under conditions of low temperature, a rising time for which the gate line is changed from a low stage to a high state and a falling time for which the gate line is changed from the high stage to the low stage increase. That is, high and low temperature reliabilities for the gate driving circuit are deteriorated.

The present invention provides a gate driving circuit capable of preventing a malfunction under condition of high and low temperatures.

The present invention also provides a display apparatus having the gate driving circuit.

The present invention also provides a method of improving temperature characteristics of a display apparatus.

In exemplary embodiments of the present invention, a gate driving circuit includes plural stages that are connected one after another to each other to sequentially output a gate signal. A present stage among the stages of the gate driving circuit includes a pull-up transistor, a buffer transistor, a discharge transistor and a pull-down transistor.

The pull-up transistor pulls up a present gate signal output through an output terminal to a gate-on voltage, a control electrode of the pull-up transistor connected to an output node Q-node, and the buffer transistor is connected to the Q-node and receives a previous output signal from a previous stage to turn on the pull-up transistor. The buffer transistor has a chargeability that is about two times or greater than a chargeability of the pull-up transistor. The discharge transistor is connected to the Q-node and receives a next output signal from a next stage to turn off the pull-up transistor. The pull-down transistor is connected to the output terminal and receives the next output signal from the next stages to pull down the present gate signal to a gate-off voltage.

In other exemplary embodiments of the present invention, a display apparatus includes a display panel displaying images in response to a gate signal and a data signal, a data driving circuit applying the data signal to the display panel, and a gate driving circuit having plural stages that are connected one after another to each other to sequentially output the gate signal to the display panel. A present stage among the stages of the gate driving circuit includes a pull-up transistor, a buffer transistor, a discharge transistor and a pull-down transistor.

The pull-up transistor pulls up a present gate signal output through an output terminal to a gate-on voltage, a control electrode of the pull-up transistor is connected to an output node Q-node, and the buffer transistor is connected to the Q-node and receives a previous output signal from a previous stage to turn on the pull-up transistor. The buffer transistor has a chargeability that is about two times or greater than a chargeability of the pull-up transistor. The discharge transistor is connected to the Q-node and receives a next output signal from a next stage to turn off the pull-up transistor. The pull-down transistor is connected to the output terminal and receives the next output signal from the next stage to pull down the present gate signal to a gate-off voltage.

In still other exemplary embodiments of the present invention, a method of improving temperature characteristics of a display apparatus having a gate driving circuit includes pulling up a present gate signal output through an output terminal to a gate-on voltage by a pull-up transistor, a control electrode of the pull-up transistor connected to an output node Q-node, receiving a previous output signal from a previous stage to turn on the pull-up transistor by a buffer transistor, the buffer transistor connected to the Q-node, receiving a next output signal from a next stage to turn off the pull-up transistor by a discharge transistor, the discharge transistor connected to the Q-node, receiving the next output signal from the next stage to pull down the present gate signal to a gate-off voltage by a pull-down transistor, the pull-down transistor connected to the output terminal, and providing a ratio of a driving current of the buffer transistor to a capacitance connected to the Q-node to be about two times or greater than a ratio of a driving current of the pull-up transistor to a capacitance connected to an output electrode of the pull-up transistor.

According to the above, since the buffer transistor has the chargeability that is about two times or greater than the chargeability of the pull-up transistor, the size of the pull-up transistor may be reduced, thereby preventing a malfunction of the gate driving circuit when the gate driving circuit is operated under conditions of high temperature or low temperature.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
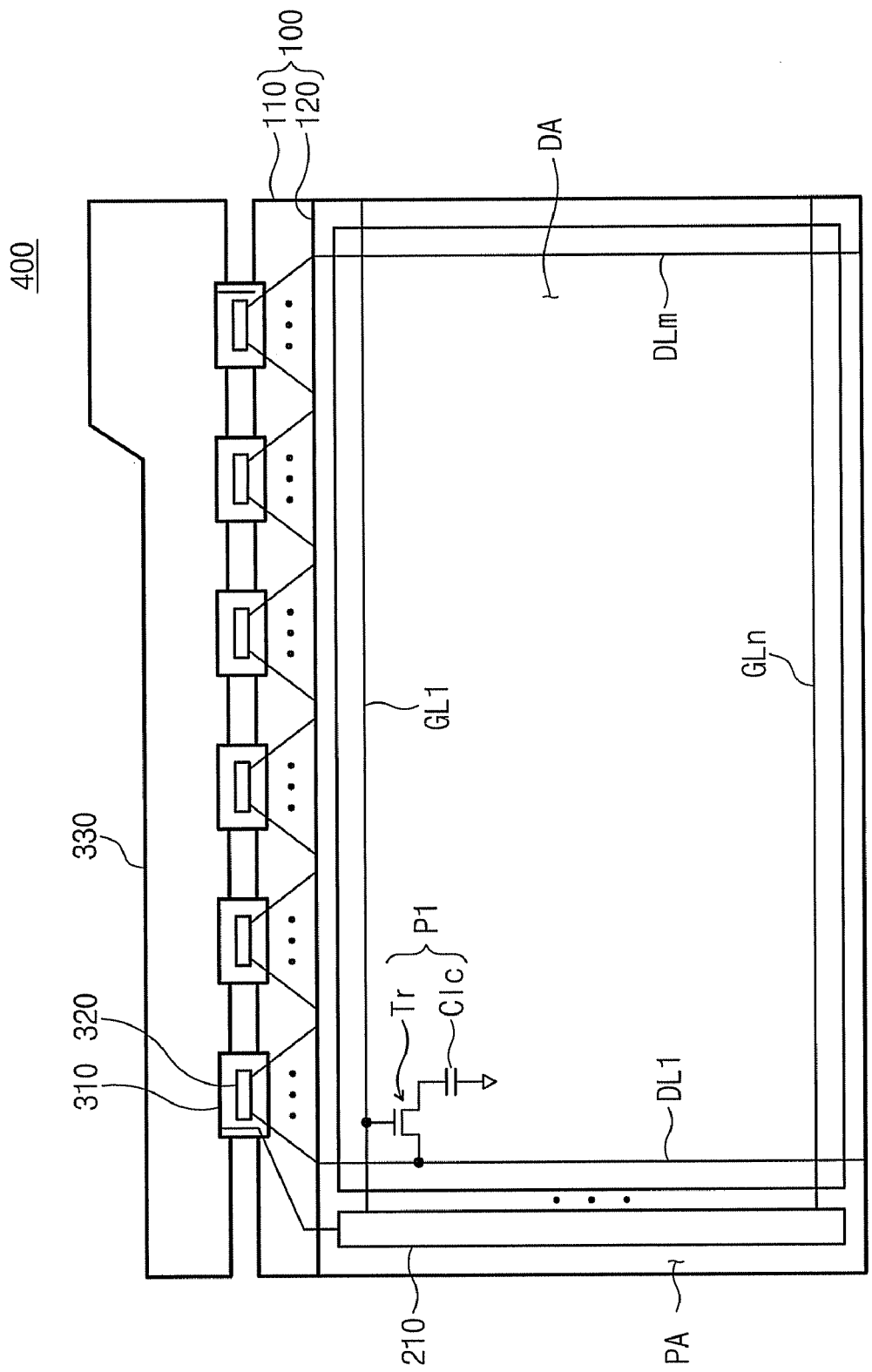
FIG. 1 is a plan view showing an exemplary embodiment of a liquid crystal display ("LCD") according to the present invention.

Hereinafter, the present invention will be explained in detail with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers, films, and regions are exaggerated for clarity. Like numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view showing an exemplary embodiment of a liquid crystal display ("LCD") according to the present invention.

Referring to FIG. 1, an LCD 400 includes an LCD panel 100 displaying an image, a plurality of data driving chips 320 outputting a data voltage to the LCD panel 100 and a gate driving circuit 210 outputting a gate signal to the LCD panel 100.

The LCD panel 100 includes a lower substrate 110, an upper substrate 120 facing the lower substrate 110 and a liquid crystal layer (not shown) interposed between the lower substrate 110 and the upper substrate 120. The LCD panel 100 is divided into a display area DA on which the image is displayed and a peripheral area PA adjacent to the display area DA and which may surround the display area DA.

The display area DA includes a plurality of pixel areas area arranged in a matrix configuration. A plurality of gate lines GL1~GLn and a plurality of data lines DL1~DLm insulated from and intersected with the gate lines GL1~GLn are formed in the LCD panel 100. In one exemplary embodiment, the pixel areas may be defined by the gate lines GL1~GLn and the data lines DL1~DLm. Each of the pixel areas includes a pixel P1 having a thin film transistor ("TFT") Tr and a liquid crystal capacitor C1c. In the present exemplary embodiment, the TFT Tr includes a gate electrode electrically connected to a first gate line GL1, a source electrode electrically connected to a first data line DL1 and a drain electrode electrically connected to a pixel electrode that serves as a first electrode of the liquid crystal capacitor C1c.

The gate driving circuit 210 is arranged in the peripheral area PA adjacent to a first end of each of the gate lines GL1~GLn. The gate driving circuit 210 is electrically connected to the first end of each of the gate lines GL1~GLn and sequentially applies the gate signal to the gate lines GL1~GLn.

A plurality of tape carrier packages ("TCPs") 310 is attached onto the peripheral area PA adjacent to a first end of each of the data lines DL1~DLm. The data driving chips 320 are mounted on the TCPs 310, respectively. The data driving chips 320 are electrically connected to the first end of each of the data lines DL1~DLm and output the data voltage to the data lines DL1~DLm.

The LCD 400 further includes a printed circuit board ("PCB") 330 to control the drive of the gate driving circuit 210 and the data driving chips 320. The PCB 330 outputs a data control signal for the data driving chips 320 and image data and outputs a gate control signal for the gate driving circuit 210. The data driving chips 320 receive the image data in synchronization with the data control signal and convert the image data into the data voltage to output the data voltage. The gate driving circuit 210 receives the gate control signal through the TCPs 310 and sequentially outputs the gate signal in response to the gate control signal.

The LCD panel 100 charges the data voltage into the liquid crystal capacitor C1c in response to the gate signal and controls the transmittance of the liquid crystal layer, thereby displaying a desired image.

In the present exemplary embodiment, the gate driving circuit 210 is substantially simultaneously formed onto the array substrate 110 with the pixels P1 through a thin film process applied to form the pixels. Since the gate driving circuit 210 is integrated within the array substrate 110, the driving chips in which the gate driving circuit 210 would otherwise be installed may be removed from the LCD 400. As a result, the productivity of the LCD 400 may be improved and the whole size of the LCD 400 may be reduced.

Figure 2:
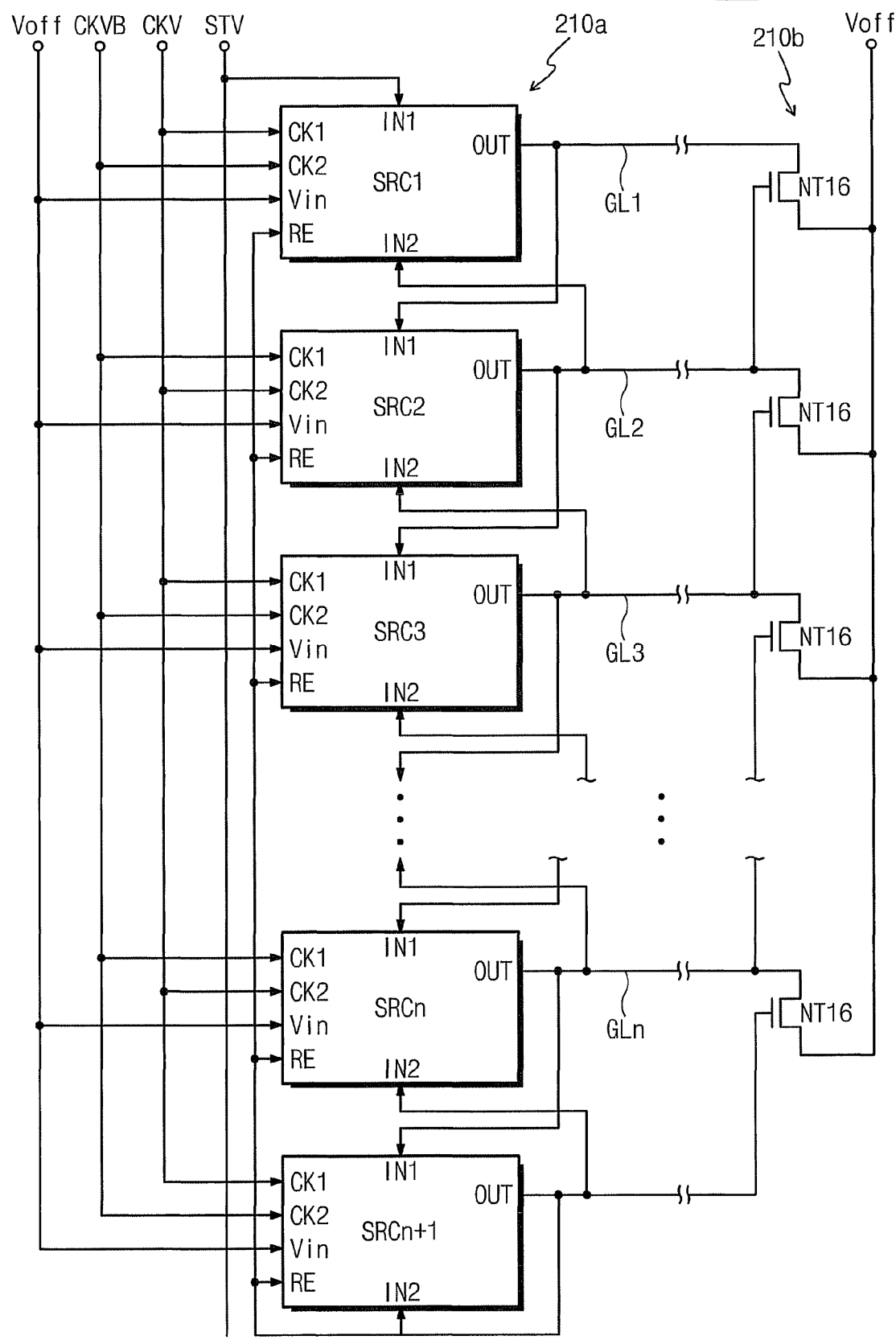
FIG. 2 is a block diagram showing an exemplary gate driving circuit of FIG. 1.

FIG. 2 is a block diagram showing the exemplary gate driving circuit of FIG. 1.

Referring to FIG. 2, the gate driving circuit 210 includes a shift register 210a in which plural stages SRC1~SRCn+1 are connected one after another to each other. Each of the stages includes a first input terminal IN1, a first clock terminal CK1, a second clock terminal CK2, a second input terminal IN2, a voltage input terminal Vin, a reset terminal RE and an output terminal OUT.

The first input terminal IN1 of each of the stages SRC2~SRCn+1 is electrically connected to the output terminal OUT of a previous stage to receive a gate signal of the previous stage. The first input terminal IN1 of a first stage SRC1 among the stages SRC1~SRCn+1 receives a start signal STV that starts the drive of the gate driving circuit 210. The second input terminal IN2 of each of the stages SRC1~SRCn1 is electrically connected to the output terminal OUT of a next stage to receive a gate signal of next stage. The second input terminal IN2 of a last stage SRCn+1 among the stages SRC1~SRCn+1 receives the start signal STV.

The first clock terminal CK1 of odd-numbered stages SRC1, SRC3, SRCn+1 among the stages SRC1~SRCn+1 receives a first clock CKV, and the second clock terminal CK2 of the odd-numbered stages SRC1, SRC3, . . . , SRCn+1 receives a second clock CKVB having an opposite phase to the first clock CKV. On the contrary, the first clock terminal CK1 of even-numbered stages SRC2, . . . , SRCn among the stages SRC1~SRCn+1 receives the second clock CKVB and the second clock terminal CK2 of the even-numbered stages SRC2, . . . , SRCn receives the first clock CKV.

The voltage input terminal Vin of the stages SRC1~SRCn+1 receives a ground voltage or a gate-off voltage Voff. Also, the output terminal OUT of the last stage SRCn+1 is electrically connected to the reset terminal RE of the stages SRC1~SRCn+1.

The output terminals OUT of the stages SRC1~SRCn are electrically connected to the gate lines GL1, GL2, GL3, . . . , GLn, respectively. Therefore, the stages SRC1~SRC may sequentially output the gate signal through the output terminals OUT and the gate signal is applied to the gate lines GL1~GLn.

The shift register 210a is arranged adjacent to first ends of the gate lines GL1~GLn. The gate driving circuit 210 further includes a discharge circuit 210b which is arranged adjacent to second ends of the gate lines GL1~GLn to discharge a present gate line to the gate-off voltage Voff in response to the next gate signal output from the next stage. The discharge circuit 210b includes the same number of discharge transistors NT16 as the number of the gate lines GL1~GLn, and each of the discharge transistors NT16 has a control electrode connected to a next gate line, an input electrode to which the gate-off voltage is applied, and an output electrode connected to the present gate line.

Figure 3:
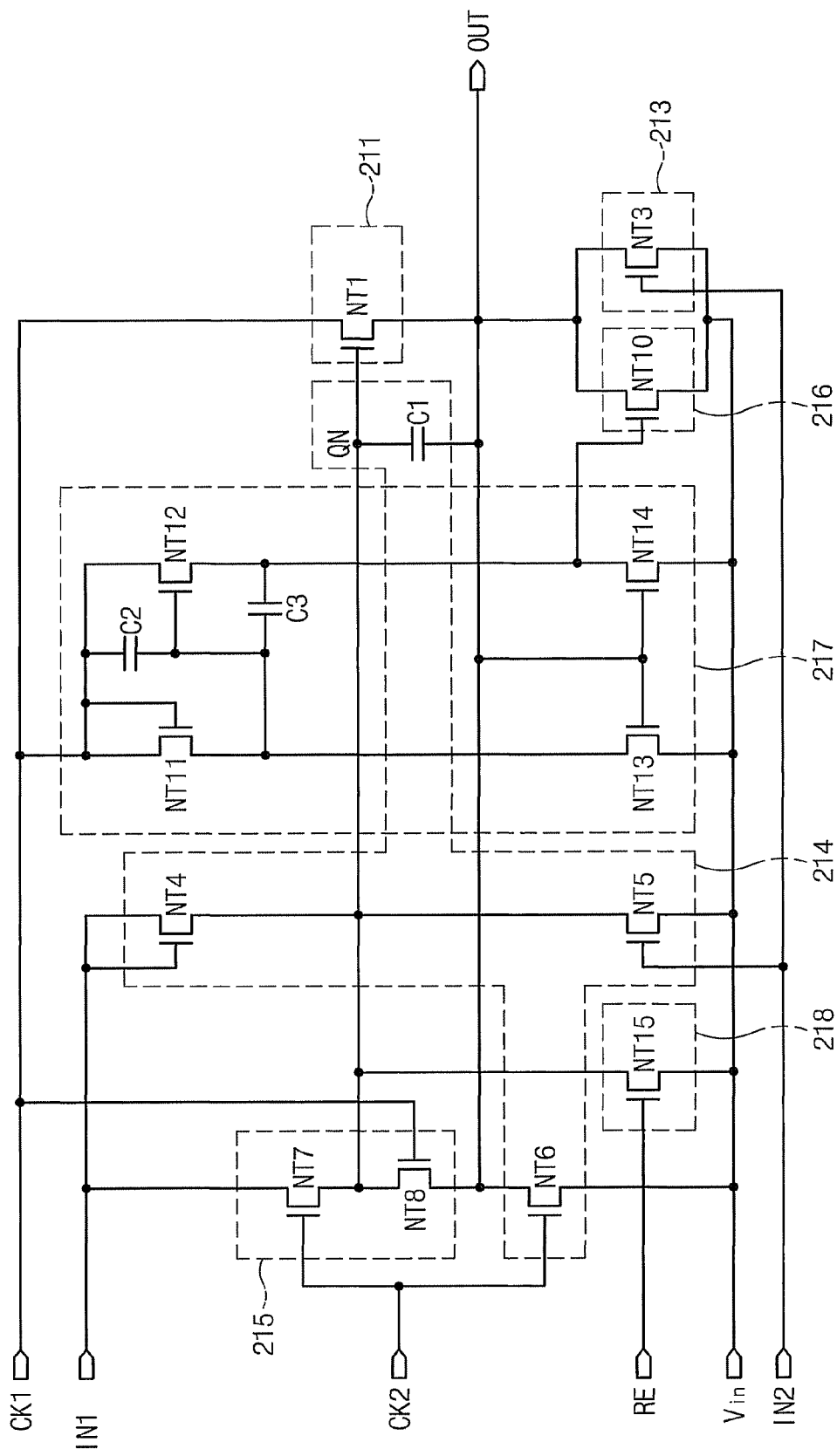
FIG. 3 is an inner circuit diagram showing each exemplary stage of FIG. 2.

FIG. 3 is an inner circuit diagram showing the exemplary stages of FIG. 2. In FIG. 3, since the stages of the gate driving circuit 210 each have a substantially same circuit configuration, only one stage of the stages will be described in detail with reference to FIG. 3 and detailed descriptions of the other stages will be omitted in order to avoid redundancy.

Referring to FIG. 3, each of the stages includes a pull-up part 211, a pull-down part 213, a pull-up driving part 214, a ripple preventing part 215, a holding part 216, an inverter 217 and a reset part 218.

The pull-up part 211 includes a pull-up transistor NT1 of which a control electrode is connected to an output node QN (hereinafter, referred to as a Q-node) of the pull-up driving part 214, an input electrode is connected to the first clock terminal CK1 and an output electrode is connected to the output terminal OUT. Thus, responsive to a control voltage output from the pull-up driving part 214 via the Q-node QN, the pull-up transistor NT1 pulls up a present gate signal that is output through the output terminal OUT to a clock CKV (hereinafter, referred to as first clock shown in FIG. 2) applied through the first clock terminal CK1. The pull-up transistor NT1 is turned on during a 1H period where the first clock CKV is maintained at high state within one frame, thereby maintaining the present gate signal at high state during the 1H period.

The pull-down part 213 includes a pull-down transistor NT3 of which a control electrode is connected to the second input terminal IN2, an input electrode is connected to the voltage input terminal Vin, and an output electrode is connected to the output terminal OUT. Responsive to the next gate signal, input via the second input terminal IN2, the pull-down transistor NT3 pulls down the present gate signal that is pulled up to the first clock CKV to the gate off voltage Voff (shown in FIG. 2) that is supplied through the voltage input terminal Vin. That is, the pull-down transistor NT3 pulls down the present gate signal to low state after the 1H period.

The pull-up driving part 214 includes a buffer transistor NT4, a first capacitor C1, a first discharge transistor NT5 and a second discharge transistor NT6. The buffer transistor NT4 includes an input electrode and a control electrode which are commonly connected to the first input terminal IN1, and an output electrode connected to the Q-node QN. The first capacitor C1 is connected between the Q-node QN and the output terminal OUT The first discharge transistor NT5 includes an input electrode connected to the output electrode of the buffer transistor NT4, a control electrode connected to the second input terminal IN2 and an output electrode connected to the voltage input terminal Vin. The second discharge transistor NT6 includes an input electrode connected to the output terminal OUT, a control electrode connected to the second clock terminal CK2, and an output electrode connected to the voltage input terminal Vin.

When the buffer transistor NT4 is turned on in response to the previous gate signal, applied via the first input terminal IN1, the first capacitor C1 is charged. When an electron charge which is higher than a threshold voltage of the pull-up transistor NT1 is charged to the first capacitor C1, an electric potential of the Q-node QN increases higher than the threshold voltage, so that the pull-up transistor NT1 is turned on. Thus, the first clock CKV is output through the output terminal OUT, thereby transiting the present gate signal to the high state. That is, the present gate signal is maintained at the high state during the high period 1H of the first clock CKV.

Then, when the first discharge transistor NT5 is turned on in response to the next gate signal via the second input terminal IN2, the electron charge that is charged to the first capacitor C1 is discharged to the gate-off voltage Voff through the first discharge transistor NT5. Thus, the electric potential of the Q-node Qn is lowered to the gate-off voltage Voff by the gate signal of the next stage, so that the pull-up transistor NT1 is turned off. That is, the discharge transistor NT5 prevents output of the present gate signal from the pull-up transistor NT1 after the 1H period.

When the second discharge transistor NT6 is turned on in response to the second clock CKVB (shown in FIG. 2) applied to the second clock terminal CK2, the output terminal OUT is electrically connected to the voltage input terminal Vin through the second discharge transistor NT6. Thus, the present gate signal from the output terminal OUT is discharged to the gate-off voltage Voff through the second discharge transistor NT6.

The ripple preventing part 215 includes a first ripple preventing transistor NT7 and a second ripple preventing transistor NT8. The ripple preventing part 215 prevents the present gate signal from being rippled by the first clock CKV or the second clock CKVB during a remaining period (hereinafter, referred to as (n−1)H period) except the 1H period within one frame.

The first ripple preventing transistor NT7 includes a control electrode connected to the second clock terminal CK2, an input electrode connected to the first input terminal IN1 and an output electrode connected to the Q-node QN. The second ripple preventing transistor NT8 includes a control electrode connected to the first clock terminal CK1, an input electrode connected to the Q-node QN and an output electrode connected to the output terminal OUT.

The first ripple preventing transistor NT7 is turned on in response to the second clock CKVB applied through the second clock terminal CK2, so that the first input terminal IN1 is electrically connected to the Q-node QN. Thus, the first ripple preventing transistor NT7 holds the electric potential of the Q-node QN to the previous gate signal that is maintained at the gate-off voltage Voff. As a result, the first ripple preventing transistor NT7 prevents the pull-up transistor NT1 from being turned on during a high period of the second clock CKVB within the (n−1)H period, thereby preventing ripple of the present gate signal.

The second ripple preventing transistor NT8 is turned on in response to the first clock CKV applied through the first clock terminal CK1, so that the output terminal OUT is electrically connected with the Q-node QN. Thus, the second ripple preventing transistor NT8 holds the electric potential of the Q-node QN to the present gate signal that is maintained at the gate-off voltage Voff. As a result, the second ripple preventing transistor NT8 prevents the pull-up transistor NT1 from being turned on during the high period of the first clock CKV within the (n−1)H period, thereby preventing ripple of the present gate signal.

The holding part 216 includes a holding transistor NT10 of which a control electrode is connected to the output terminal of the inverter 217, which will be further described below, an input electrode is connected to the voltage input terminal Vin and an output electrode is connected to the output terminal OUT.

The inverter 217 includes a first inverter transistor NT11, a second inverter transistor NT12, a third inverter transistor NT13, a fourth inverter transistor NT14, a second capacitor C2 and a third capacitor C3 in order to turn on or turn off the holding transistor NT10.

The first inverter transistor NT11 includes an input electrode and a control electrode commonly connected to the first clock terminal CK1 and an output electrode connected to the first electrode of the third capacitor C3. The second inverter transistor NT12 includes an input electrode commonly connected to the first clock terminal CK1 and the first electrode of second capacitor C2, a control electrode commonly connected to the second electrode of the second capacitor C2 and output electrode of the first inverter transistor NT11, and an output electrode connected to the second electrode of the third capacitor C3 as well as the control electrode of the holding transistor NT10. The third inverter transistor NT13 includes an input electrode connected to the output electrode of the first inverter transistor NT11, a control electrode connected to the output terminal OUT and an output electrode connected to the voltage input terminal Vin. The fourth inverter transistor NT14 includes an input electrode connected to the control electrode of the holding transistor NT10, a control electrode connected to the output terminal OUT and an output electrode connected to the voltage input terminal Vin.

The third inverter transistor NT13 and the fourth inverter transistor NT14 are turned on in response to the present gate signal that is maintained at the high state output through the output terminal OUT, and output from the first inverter transistor NT11 and the second inverter transistor NT12 is discharged to the gate-off voltage Voff. Thus, the holding transistor NT10 is turned off during the 1H period where the present gate signal is maintained at the high state. Then, when the present gate signal is transited to the low state, the third inverter transistor NT13 and the fourth inverter transistor NT14 are turned off. Accordingly, responsive to the first clock CKV output from the first and second inverter transistors NT11 and NT12, the holding transistor NT10 is turned on. As a result, the present gate signal may be held at the gate-off voltage Voff during the high period of the first clock CKV within the (n−1)H period by the holding transistor NT10.

The reset part 218 includes a reset transistor NT15 having a control electrode connected to the reset terminal RE, an input electrode connected to the control electrode of the pull-up transistor NT1 and an output electrode connected to the voltage input terminal Vin. The reset transistor NT15 discharges a noise input at control electrode of the pull-up transistor NT1 to the gate-off voltage Voff in response to a last gate signal input through the reset terminal RE and output from the last stage SRCn+1 (shown in FIG. 2). Thus, the pull-up transistor NT1 is turned off in response to the last gate signal from the last stage SRCn+1. As a result, the last gate signal is provided to the reset terminal RE of n stages provided prior to the last stage SRCn+1 so as to turn off the pull-up transistor NT1 of n stages, thereby resetting the n stages.

If the gate driving circuit 210 is operated under conditions of high temperature, then a malfunction may occur in the gate driving circuit 210. Particularly, a ripple voltage at the Q-node QN and a off-state leakage current of the pull-up transistor NT1 may cause the malfunction of the gate driving circuit 210.

The ripple voltage Vr in the Q-node QN satisfies an equation as follows:

$$Vr \propto \frac{(Cgd - Cgs)}{Ctot} \Delta Vck$$

In the equation, Vr represents the ripple voltage of the Q-node QN, Cgd represents capacitance of a first parasitic capacitor between the control electrode and the input electrode of the pull-up transistor NT1, Ctot represents capacitance of a total capacitor connected to the Q-node QN, including a second parasitic capacitance Cgs_NT1 between the control electrode and the output electrode of the pull-up transistor NT1, and Cgs represents capacitance of a third parasitic capacitor between the control electrode and the output electrode of the pull-up transistor NT7, ΔVck represents a voltage difference between the first clock CKV and the second clock CKVB.

According to the equation, in order to decrease the ripple voltage Vr of the Q-node QN, capacitance of the first parasitic capacitor Cgd may be decreased, and the total capacitance Ctot connected to the Q-node QN may be increased.

Thus, a channel width W of the pull-up transistor NT1 is decreased in order to decrease the first parasitic capacitor Cgd. In addition, since a leakage current of the pull-up transistor NT1 is proportioned to an on-resistance of the pull-up transistor NT1, the leakage current may be decreased by increased the on-resistance in accordance with decreased channel width of the pull-up transistor NT1.

In an exemplary embodiment of the present invention, the second parasitic capacitor Cgs is preferably 5 times or greater than the first parasitic capacitor Cgd, so that ripple voltage Vr of the Q-node may be decreased.

In the present exemplary embodiment, the on-resistance of the pull-up transistor NT1 may be set to be 3KΩ or greater than the 3 KΩ, where the on-resistance is defined by dividing a threshold voltage of the pull-up transistor NT1 by a driving current.

Also, in order to increase the ripple voltage Vr of the Q-node QN, driving currents of the first and second ripple preventing transistors NT7 and NT8 connected to the Q-node QN are increased. In the present exemplary embodiment, W/L of the first and the second ripple preventing transistor NT7 and NT8 is about five times or greater than W/L of the pull-up transistor NT1, wherein the W/L of the pull-up transistor NT1 is equal to a ratio of a channel width to a channel length of a transistor.

If the gate driving circuit 210 is operated under conditions of low temperature, then a malfunction may occur in the gate driving circuit 210. This is because chargeabilities of the buffer transistor NT4, the first ripple preventing transistor NT7, the second ripple preventing transistor NT8 and the pull-up transistor NT1 are lowered. In the present exemplary embodiment, a chargeability of the buffer transistor NT4 connected to the Q-node QN is about two times or greater than a chargeability of the pull-up transistor NT1.

Particularly, a ratio of W/L of the buffer transistor NT4 to a capacitance connected to the buffer transistor NT4 is two times or greater, or about two times or greater, than a ratio of W/L of the pull-up transistor NT1 to a capacitance connected to the pull-up transistor NT1.

However, if the chargeability of the pull-up transistor NT1 increases, the malfunction of the gate driving circuit 210 still occurs. Therefore, in the present exemplary embodiment, the chargeabilities of the first and second ripple preventing transistors NT7 and NT8 increase.

Thus, when the size of the pull-up transistor NT1 is adjusted, temperature characteristics of the gate driving circuit 210 may be improved.

Figure 4:
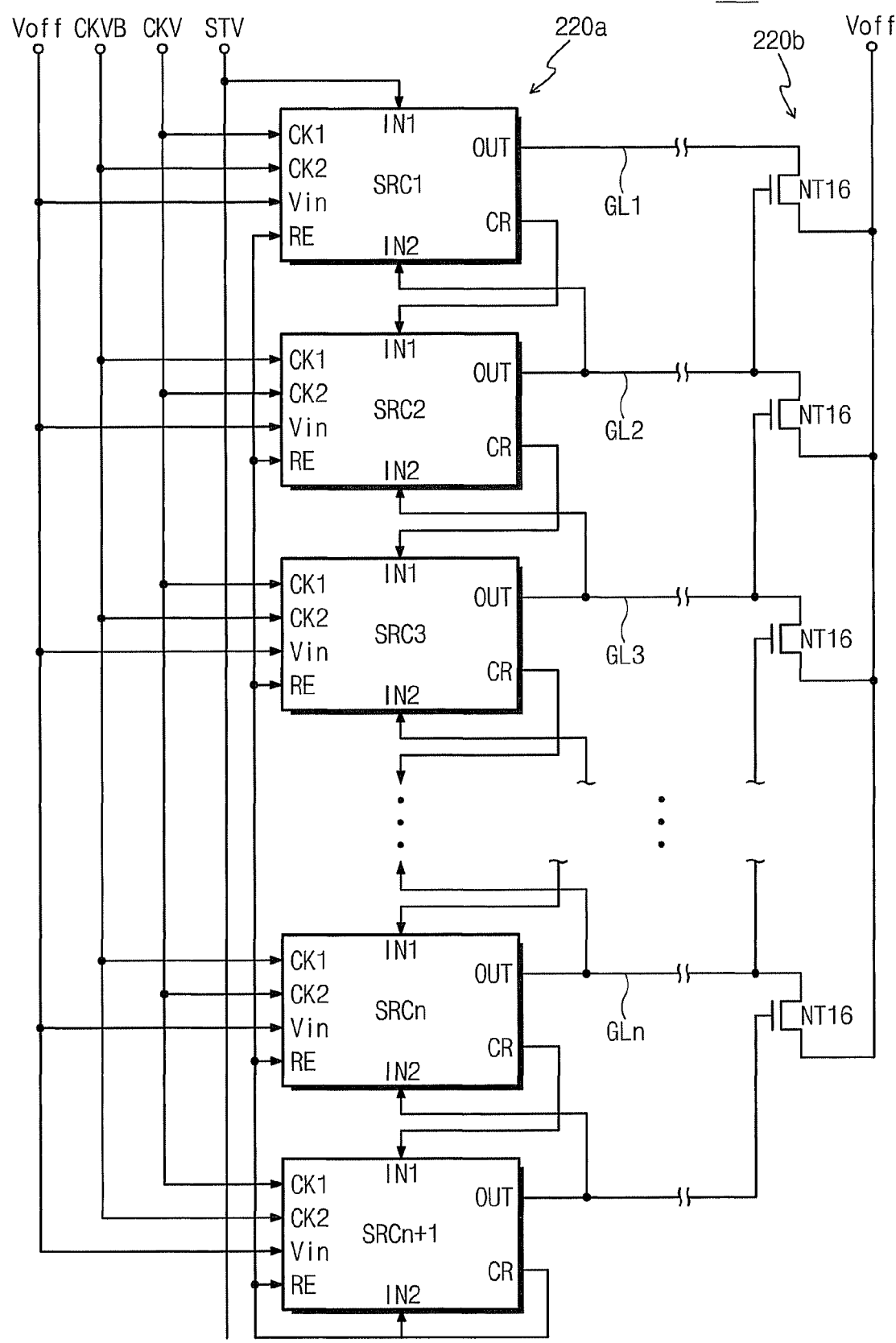
FIG. 4 is a block diagram showing another exemplary embodiment of a gate driving circuit according to the present invention.
Figure 5:
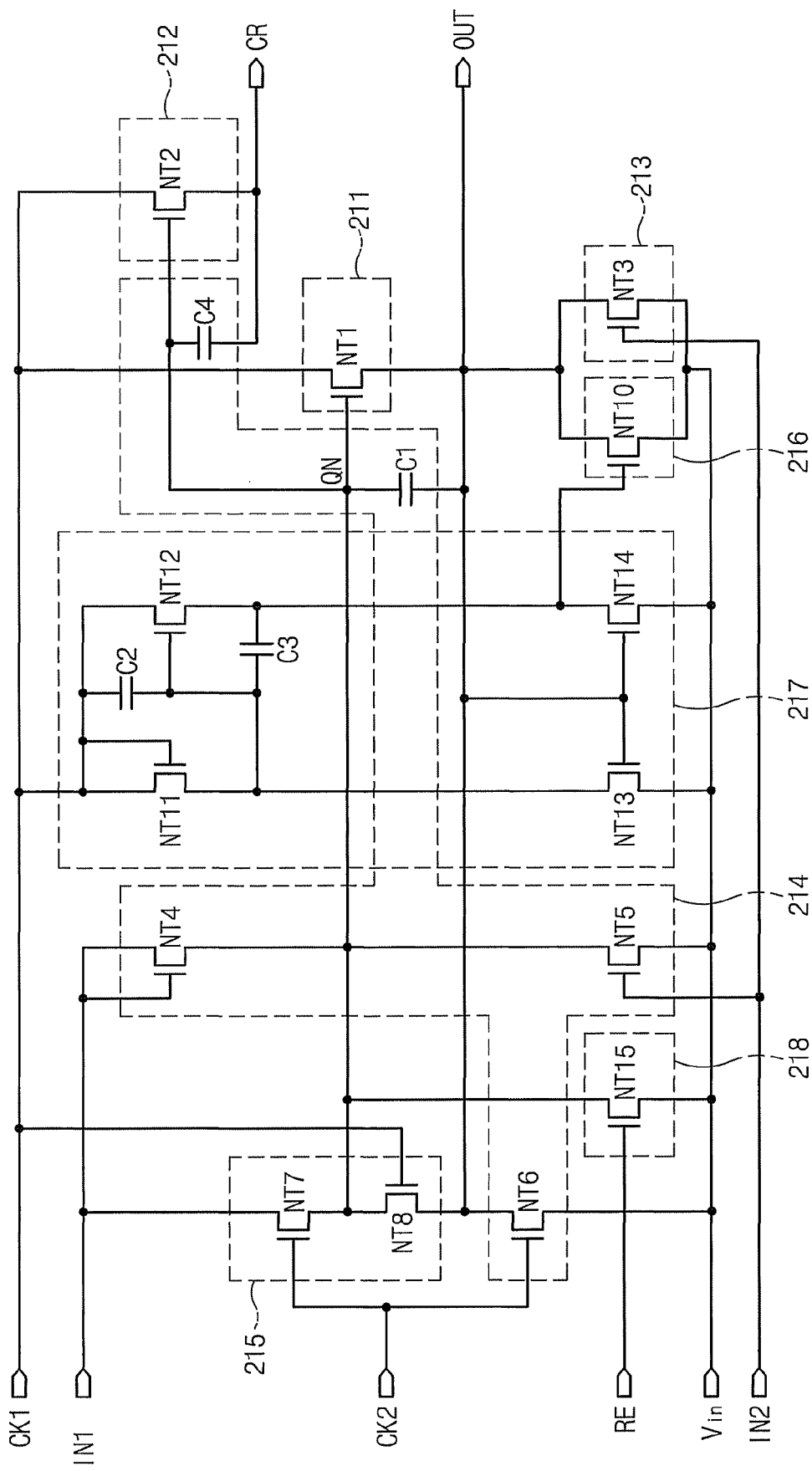
FIG. 5 is an inner circuit diagram showing each exemplary stage of FIG. 4.

FIG. 4 is a block diagram showing another exemplary embodiment of a gate driving circuit according to the present invention, and FIG. 5 is an inner circuit diagram showing each exemplary stage of FIG. 4. In FIGS. 4 and 5, the same reference numerals denote the same elements in FIGS. 2 and 3, and thus the detailed descriptions of the same elements will be omitted.

Referring to FIG. 4, a gate driving circuit 220 includes a shift register 220a of which plural stages SRC1~SRCn+1 are connected one after another to each other. Each of the stages SRC1~SRCn+1 includes a first input terminal IN1, a first clock terminal CK1, a second clock terminal CK2, a voltage input terminal Vin, a reset terminal RE, an output terminal OUT and a carry terminal CR.

The first input terminal IN1 of each of the stages SRC2~SRCn+1 is electrically connected to the output terminal OUT of a previous stage to receive a previous carry signal. The second input terminal IN2 of each of the stages SRC1~SRCn is electrically connected to the output terminal OUT of a next stage to receive a gate signal of the next stage.

Since the next stage is operated in response to the present carry signal that is less delayed and distorted than the present gate signal, the output characteristic of the gate driving circuit 220 may be improved.

As shown in FIG. 5, each of the stages SRC1~SRCn+1 includes a pull-up part 211, a carry part 212, a pull-down part 213, a pull-up driving part 214, a ripple preventing part 215, a holding part 216, an inverter 217 and a reset part 218.

The carry part 212 includes a carry transistor NT2 having a control electrode connected to the Q-node QN of the pull-up driving part 214, an input electrode connected to the first clock terminal CK1 and an output electrode connected to the carry terminal CR. Thus, the carry transistor NT2 pulls up a present carry signal output through the output terminal OUT to a clock CKV (hereinafter, referred to as first clock, shown in FIG. 4) provided through the first clock terminal CK1 in response to a control voltage output from the pull-up driving part 214. The carry transistor NT2 is turned on during a 1H period where the first clock CKV is maintained at a high state within one frame, thereby maintaining the present carry signal at the high state during the 1H period.

If the gate driving circuit 220 is operated under conditions of low temperature and high frequency, then a malfunction may occur in the gate driving circuit 220. This is because chargeabilities of the carry transistor NT2, the buffer transistor NT4, the first ripple preventing transistor NT7, the second ripple preventing transistor NT8 and the pull-up transistor NT1 are lowered. However, if the chargeability of the pull-up transistor NT1 increases, the malfunction still occurs in the gate driving circuit 220. Thus, in the present exemplary embodiment, the chargeabilities of the carry transistor NT2, the buffer transistor NT4, the first and second ripple preventing transistors NT7 and NT8 are increased.

More specifically, a ratio of W/L of the carry transistor NT2 to a capacitance connected to the carry transistor NT2 is two times or greater than, or about two times or greater than, the ratio of the W/L of the pull-up transistor NT1 to the capacitance connected to the pull-up transistor NT1. Also, a ratio of W/L of the buffer transistor NT4 to a capacitance connected to the buffer transistor NT4 is two times or greater than, or about two times or greater than, the ratio of W/L of the pull-up transistor NT1 to the capacitance connected to the pull-up transistor NT1.

Also, the ratio of the channel width to the channel length of the first and second ripple preventing transistors NT7 and NT8 is five times or greater than, or about five times or greater than, the ratio of the channel width to the channel length of the pull-up transistor NT1. Thus, low temperature and high frequency characteristics of the gate driving circuit 220 may be improved when the size of transistors connected to the Q-node QN is adjusted.

Figure 6:
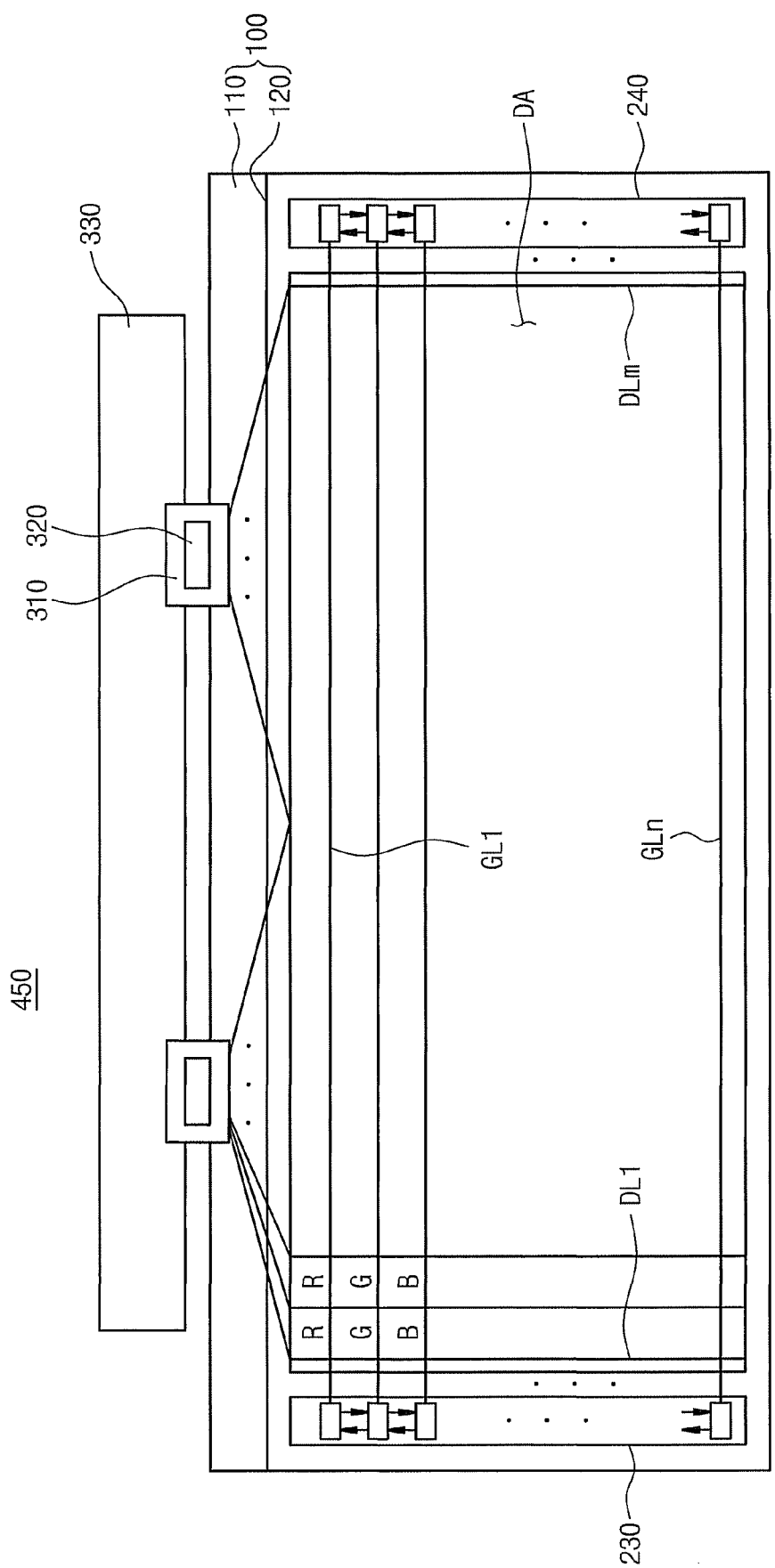
FIG. 6 is a plan view showing another exemplary embodiment of an LCD according to the present invention.

FIG. 6 is a plan view showing another exemplary embodiment of an LCD according to the present invention.

Referring to FIG. 6, an LCD 450 includes an LCD panel 100 having a lower substrate 110, an upper substrate 120 facing the lower substrate 110 and a liquid crystal layer (not shown) interposed between the lower substrate 110 and the upper substrate 120.

In a display area DA of the lower substrate 110, a plurality of pixels is arranged in a matrix configuration, and a plurality of gate lines GL1~GLn and a plurality of data lines DL1~DLm intersecting with and insulating from the gate lines GL1~GLn are formed on the lower substrate 110. Particularly, the display area DA includes a plurality of pixel areas. In one exemplary embodiment, the pixel areas may be defined by the gate lines GL1~GLn and the data lines DL1~DLm. Pixels are arranged in the pixel areas, respectively. The upper substrate 120 may include color filters to define color pixels (e.g. red, green and blue color pixels) corresponding to the pixel areas in a one-to-one correspondence relationship.

The LCD 450 includes a first gate driving circuit 230 and a second gate driving circuit 240 arranged in the LCD panel 100. The first gate driving circuit 230 is arranged adjacent to first ends of the gate lines GL1~GLn arranged in the LCD panel 100, and the second gate driving circuit 240 is arranged adjacent to second ends of the gate lines GL1~GLn.

The first gate driving circuit 230 sequentially outputs a gate signal to the gate lines GL1~GLn, and the second gate driving circuit 240 is substantially simultaneously driven with the first gate driving circuit 230 to sequentially output the gate signal to the gate lines GL1~GLn. As a result, the gate signal is substantially simultaneously applied to the first ends and the second ends of the gate lines GL1~GLn. Since the gate signal is applied through the first ends and the second ends in order to turn on the gate lines GL1~GLn, a delay of the gate signal may be prevented.

Each of the first gate driving circuit 230 and the second gate driving circuit 240 includes plural stages connected one after another to each other. Since the first and second gate driving circuits 230 and 240 have the same circuit configuration as either of the gate driving circuits 210 and 220 shown in FIGS. 3 and 5, detailed descriptions of the first and second gate driving circuits 230 and 240 will be omitted.

As shown in FIG. 6, the pixels arranged in the lower substrate 110 have a horizontal pixel structure extended in a direction to which the gate lines GL1~GLn are extended. In the horizontal pixel structure, three pixels corresponding to the red R, green G and blue B color pixels, respectively, that are consecutively arranged in a direction to which the data lines DL1~DLm are extended are defined as one pixel displaying one color information. In the horizontal pixel structure, the number of data lines decreases and the number of gate lines increases when compared to those of the vertical pixel structure.

When the number of data lines decreases likewise, the number of data driving chips 310 outputting the data signal decreases as well, thereby improving productivity of the LCD 450. On the other hand, although the number of gate lines increases, the number of chips in the LCD 450 does not increase since the first gate driving circuit 230 and the second gate driving circuit 240 are directly integrated onto the lower substrate 110 through a thin film process.

Figure 7:
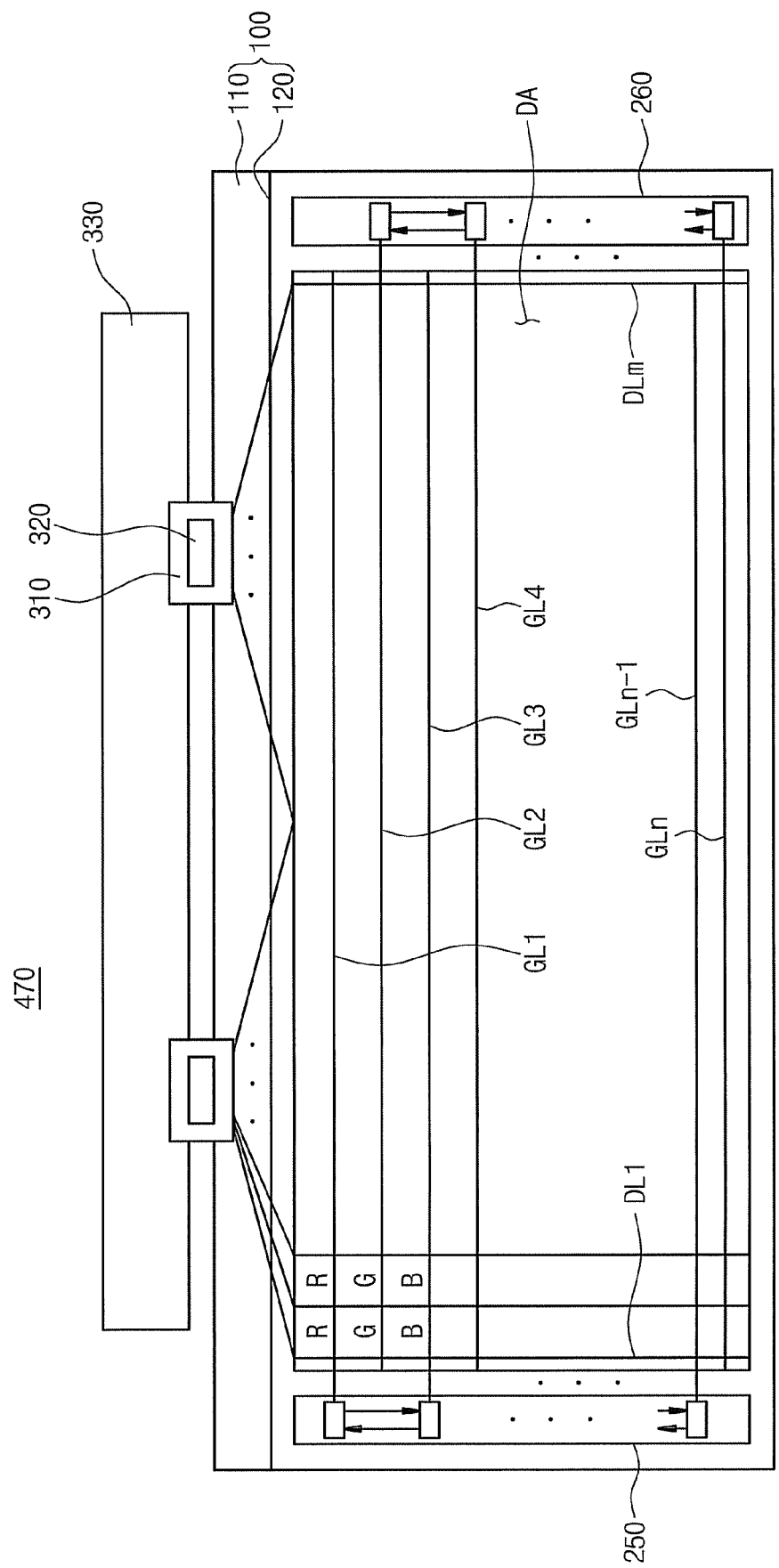
FIG. 7 is a plan view showing another exemplary embodiment of an LCD according to the present invention.

FIG. 7 is a plan view showing another exemplary embodiment of an LCD according to the present invention. In FIG. 7, the same reference numerals denote the same elements in FIG. 6, and thus the detailed descriptions of the same elements will be omitted.

Referring to FIG. 7, an LCD 470 includes an LCD panel 100 having a first gate driving circuit 250 and a second gate driving circuit 260. Particularly, the first gate driving circuit 250 is arranged adjacent to first ends of odd-numbered gate lines GL1, GL3, . . . , GLn−1 among the gate lines GL1~GLn, and the second gate driving circuit 260 is arranged adjacent to second ends of even-numbered gate lines GL2, GL4, . . . , GLn among the gate lines GL1~GLn.

The first gate driving circuit 250 sequentially outputs the gate signal to the odd-numbered gate lines GL1, GL3, . . . , GLn−1, and the second gate driving circuit 260 sequentially outputs the gate signal to the even-numbered gate lines GL2, GL4, . . . , GLn. Each of the first and second gate driving circuits 250 and 260 includes plural stages connected one after another to each other. In the present exemplary embodiment, the number of stages in each of the first and second gate driving circuits 250 and 260 is half of the number of stages in each of the first and second gate driving circuits 230 and 240 shown in FIG. 6. Thus, the gate signal output from the first and the second gate driving circuits 250 and 260 may be prevented from being distorted.

In the present exemplary embodiment, the first and second gate driving circuits 250 and 260 have the same circuit configuration as those of either of the gate driving circuits 210 and 220 shown in FIGS. 3 and 5, and the detailed descriptions of the first and second gate driving circuits 250 and 260 will be omitted.

According to the above, since the buffer transistors, the carry transistor, and the first and second ripple preventing transistors have the chargeability that is about two times or greater than the chargeability of the pull-up transistor, the size of the pull-up transistor may be reduced.

Thus, the whole size of the gate driving circuit may be reduced and the malfunction of the gate driving circuit that occurs when the gate driving circuit is operated under conditions of the high temperature or the low temperature may be prevented.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A gate driving circuit in which plural stages are connected one after another to each other to sequentially output a gate signal, each of the stages comprising:

a pull-up transistor which pulls up a present gate signal output through an output terminal to a gate-on voltage, a control electrode of the pull-up transistor connected to a Q-node;

a buffer transistor which receives a previous output signal from a previous stage to turn on the pull-up transistor, an output electrode of the buffer transistor connected to the Q-node;

a discharge transistor which receives a next output signal from a next stage to turn off the pull-up transistor, an input electrode of the discharge transistor connected to the Q-node; and a pull-down transistor which receives the next output signal from the next stage to pull down the present gate signal to a gate-off voltage, the pull-down transistor connected to the output terminal, and wherein a ratio of W/L of the buffer transistor to a capacitance connected to the Q-node is about two times or greater than a ratio of W/L of the pull-up transistor to a capacitance connected to an output electrode of the pull-up transistor.

2. The gate driving circuit of claim 1, wherein an on-resistance of the pull-up transistor is equal to or greater than about 3KΩ, and the on-resistance is defined by dividing a threshold voltage of the pull-up transistor by the driving current of the pull-up transistor at the threshold voltage.

3. The gate driving circuit of claim 1, wherein a second parasitic capacitance between the control electrode and the output electrode of the pull-up transistor is about five times or greater than a first parasitic capacitance between the control electrode and an input electrode of the pull-up transistor.

4. The gate driving circuit of claim 1, wherein each of the stages further comprises a first ripple preventing transistor which maintains an electric potential of the Q-node at the gate-off voltage in response to a clock bar signal, and the output electrode of first ripple preventing transistor is connected to the Q-node.

5. The gate driving circuit of claim 4, wherein W/L of the first ripple preventing transistor is about five times or greater than the W/L of the pull-up transistor.

6. The gate driving circuit of claim 4, wherein each of the stages further comprises a second ripple preventing transistor which maintains the electric potential of the Q-node at the gate-off voltage in response to a first clock signal, the output electrode of second ripple preventing transistor is connected to the Q-node, W/L of the second ripple preventing transistor is about five times or greater than the W/L of the pull-up transistor.

7. The gate driving circuit of claim 1, wherein the previous output signal is a previous gate signal output from a previous output terminal, and the next output signal is a next gate signal output from a next output terminal.

8. The gate driving circuit of claim 1, further comprising a carry transistor having a control terminal connected to the Q-node to pull up a present carry signal output through a carry terminal to the gate-on voltage.

9. The gate driving circuit of claim 8, wherein a ratio of W/L of the carry transistor to a capacitance connected to the carry transistor is about two times or greater than the ratio of the W/L of the pull-up transistor to the capacitance connected to the output electrode of the pull-up transistor.

10. The gate driving circuit of claim 8, wherein the previous output signal is a previous carry signal output from a previous carry terminal, and the next output signal is a next gate signal output from a next gate terminal.

11. A display apparatus comprising:

a display panel which displays images in response to a gate signal and a data signal;

a data driving circuit which applies the data signal to the display panel; and a gate driving circuit which sequentially outputs the gate signal to the display panel, the gate driving circuit comprising plural stages connected one after another to each other, a present stage among the stages of the gate driving circuit comprising:

a pull-up transistor which pulls up a present gate signal output through an output terminal to a gate-on voltage, a control electrode of the pull-up transistor connected to a Q-node;

a buffer transistor which receives a previous output signal from a previous stage to turn on the pull-up transistor, an output electrode of the buffer transistor connected to the Q-node;

a discharge transistor which receives a next output signal from a next stage to turn off the pull-up transistor, an input electrode of the discharge transistor connected to the Q-node; and a pull-down transistor which receives the next output signal from the next stage to pull down the present gate signal to a gate-off voltage, the pull-down transistor connected to the output terminal, and wherein a ratio of W/L of the buffer transistor to a capacitance connected to the Q-node is about two times or greater than a ratio of W/L of the pull-up transistor to a capacitance connected to an output electrode of the pull-up transistor.

12. The display apparatus of claim 11, wherein the present stage further comprises:

a first ripple preventing transistor which maintains an electric potential of the Q-node at the gate-off voltage in response to a clock bar signal, the first ripple preventing transistor connected to the Q-node; and a second ripple preventing transistor which maintains the electric potential of the Q-node at the gate-off voltage in response to a first clock signal, the second ripple preventing transistor connected to the Q-node, and wherein W/L of each of the first and second ripple preventing transistors is about five times or greater than the W/L of the pull-up transistor.

13. The display apparatus of claim 11, wherein the present stage further comprises a carry transistor having a control terminal connected to the Q-node to pull up a present carry signal output through a carry terminal to the gate-on voltage, and wherein a ratio of W/L of the carry transistor to a capacitance connected to the carry transistor is about two times or greater than the ratio of the W/L of the pull-up transistor to the capacitance connected to the output electrode of the pull-up transistor.

14. The display apparatus of claim 11, wherein the display panel comprises:

an array substrate including a plurality of gate lines which sequentially receive the gate signal, a plurality of data lines which receive the data signal, and a plurality of pixels which receive the data signal in response to the gate signal;

an opposite substrate including a common electrode which receives a common voltage that is a reference voltage of the data signal, the opposite substrate being combined with the array substrate; and a liquid crystal layer disposed between the array substrate and the opposite substrate.

15. The display apparatus of claim 14, wherein the gate driving circuit is directly formed on the array substrate through a thin film process applied to form the pixels on the array substrate.

16. The display apparatus of claim 15, wherein the gate driving circuit further comprises:

a first gate driving circuit electrically connected to first ends of the gate lines; and a second gate driving circuit electrically connected to second ends of the gate lines.

17. The display apparatus of claim 15, wherein the gate driving circuit further comprises:

a first gate driving circuit electrically connected to first ends of odd-numbered gate lines among the gate lines; and a second gate driving circuit electrically connected to second ends of even-numbered gate lines among the gate lines.

18. The display apparatus of the claim 15, wherein each of the pixels has a horizontal pixel structure of which a length extended in a direction to which the gate lines extend is longer than a length extended in a direction to which the data lines extend.

19. The display apparatus of claim 18, wherein the opposite substrate comprises red, green and blue color filters corresponding to three consecutive pixels extended in the direction to which the data lines extend, and the three consecutive pixels are defined as one pixel displaying one color information.

20. A method of improving temperature characteristics of a display apparatus having a gate driving circuit, the method comprising:

pulling up a present gate signal output through an output terminal to a gate-on voltage by a pull-up transistor, a control electrode of the pull-up transistor connected to a Q-node;

receiving a previous output signal from a previous stage to turn on the pull-up transistor by a buffer transistor, an output electrode of the buffer transistor connected to the Q-node;

receiving a next output signal from a next stage to turn off the pull-up transistor by a discharge transistor, an input electrode of the discharge transistor connected to the Q-node;

receiving the next output signal from the next stage to pull down the present gate signal to a gate-off voltage by a pull-down transistor, the pull-down transistor connected to the output terminal; and providing a ratio of W/L of the buffer transistor to a capacitance connected to the Q-node to be about two times or greater than a ratio of W/L of the pull-up transistor to a capacitance connected to an output electrode of the pull-up transistor.

* * * * *